United States Patent
Rawat

(10) Patent No.: US 6,849,293 B2
(45) Date of Patent: Feb. 1, 2005

(54) METHOD TO MINIMIZE ISO-DENSE CONTACT OR VIA GAP FILLING VARIATION OF POLYMERIC MATERIALS IN THE SPIN COAT PROCESS

(75) Inventor: Pawan Rawat, Jaipur (IN)

(73) Assignee: Institute of Microelectronics, Singapore (SG)

( * ) Notice: Subject to any disclaimer, the term of this patent is extended or adjusted under 35 U.S.C. 154(b) by 247 days.

(21) Appl. No.: 10/139,050

(22) Filed: May 2, 2002

(65) Prior Publication Data

US 2003/0207029 A1 Nov. 6, 2003

(51) Int. Cl.$^7$ .............................. B05D 3/12; B05D 7/00
(52) U.S. Cl. ..................... 427/96; 427/240; 427/256; 427/352; 427/385.5; 427/425; 118/52; 118/320; 438/618; 438/633; 438/780; 438/782
(58) Field of Search .................... 427/96, 97, 240, 427/425, 352, 385.5, 256; 438/618, 633, 780, 782; 118/52, 320

(56) References Cited

U.S. PATENT DOCUMENTS

| | | | | |
|---|---|---|---|---|
| 4,741,926 A | | 5/1988 | White et al. ............... | 427/240 |
| 5,070,813 A | * | 12/1991 | Sakai et al. ................ | 118/695 |
| 5,567,660 A | * | 10/1996 | Chen et al. ................ | 438/763 |
| 6,004,622 A | * | 12/1999 | Yen et al. .................. | 427/240 |
| 6,042,999 A | | 3/2000 | Lin et al. ................... | 430/316 |
| 6,251,487 B1 | | 6/2001 | Yonaha ...................... | 427/425 |
| 6,319,821 B1 | | 11/2001 | Liu et al. ................... | 438/636 |
| 6,391,472 B1 | * | 5/2002 | Lamb et al. ................ | 428/624 |
| 6,455,416 B1 | * | 9/2002 | Subramanian et al. ...... | 438/636 |
| 6,475,905 B1 | * | 11/2002 | Subramanian et al. ...... | 438/637 |
| 6,479,879 B1 | * | 11/2002 | Pike et al. .................. | 257/437 |
| 6,605,546 B1 | * | 8/2003 | Subramanian et al. ...... | 438/725 |
| 2003/0087535 A1 | * | 5/2003 | Matsuura .................... | 438/782 |

* cited by examiner

*Primary Examiner*—Kristen C. Jolley
(74) *Attorney, Agent, or Firm*—George O. Saile; Stephen B. Ackerman; Stephen G. Stanton

(57) ABSTRACT

A method for spin coating a polymeric material film upon a wafer rotatably mounted within a spin coater; the wafer having a surface, including the following steps. A first step of rotating the wafer on an axis perpendicular to the wafer surface while applying a predetermined amount of polymeric material while rotating the wafer at a rotational speed of from about 300 to 1200 rpm for from about 2.5 to 5 seconds to spread the polymeric material on the whole surface of the wafer. A second step of increasing the rotational speed of the wafer to about 5500 rpm for about 2.5 seconds. A third step of decreasing the rotational speed of the wafer to about 300 to 1200 rpm for about 2.5 seconds. A fourth step of increasing the rotational speed of the wafer to about 5500 rpm for about 20 seconds to form the polymeric material film having a predetermined thickness over the whole surface of the wafer.

44 Claims, 7 Drawing Sheets

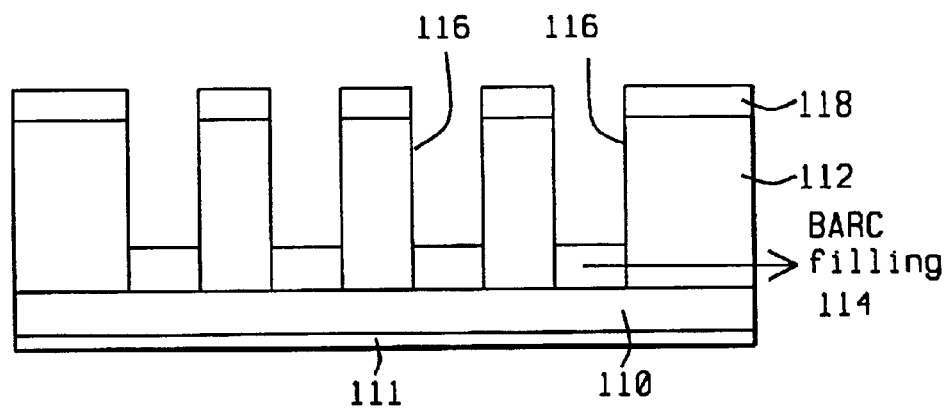
FIG. 1A – Prior Art
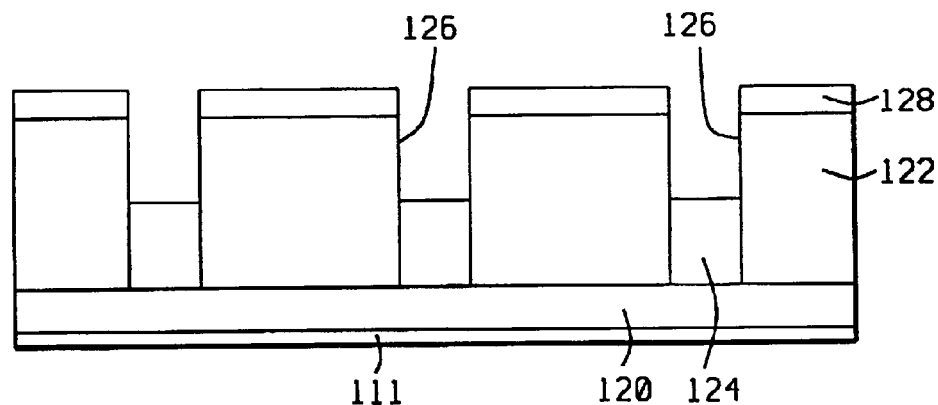
FIG. 1B – Prior Art
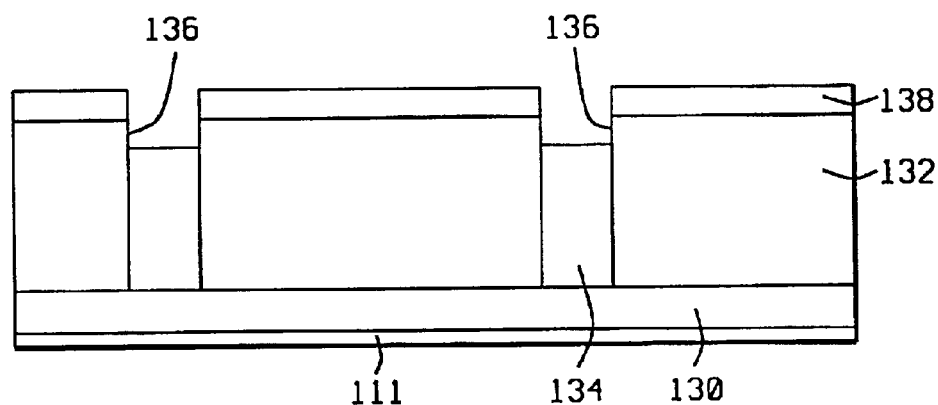
FIG. 1C – Prior Art

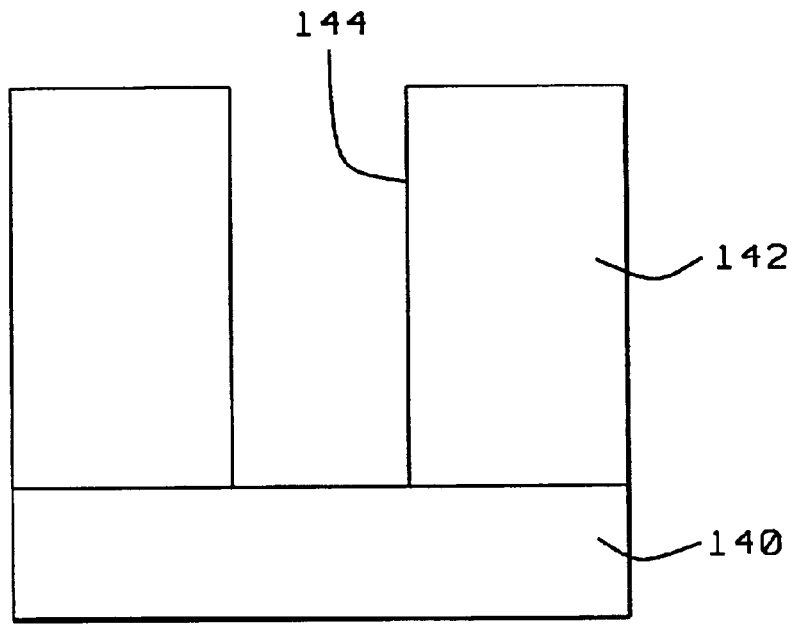
FIG. 2A - Prior Art
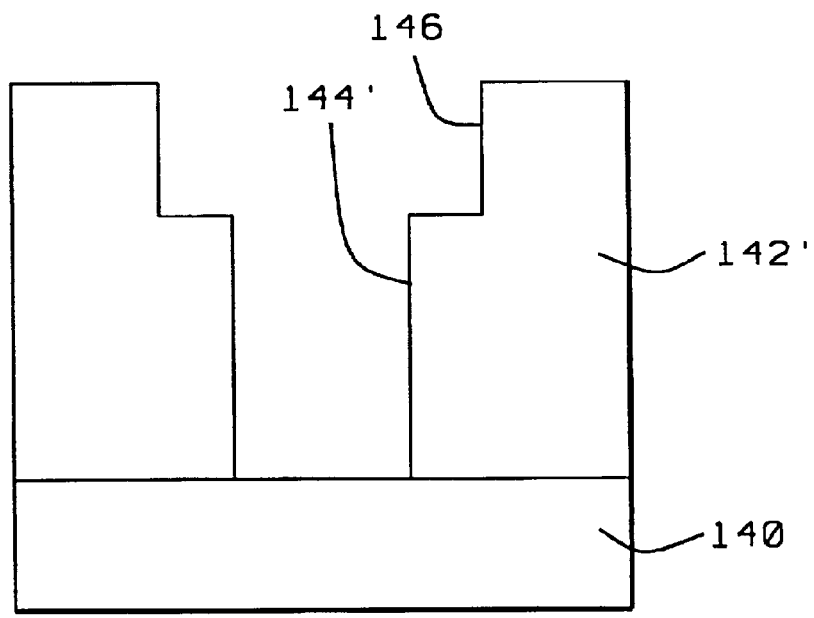
FIG. 2B - Prior Art

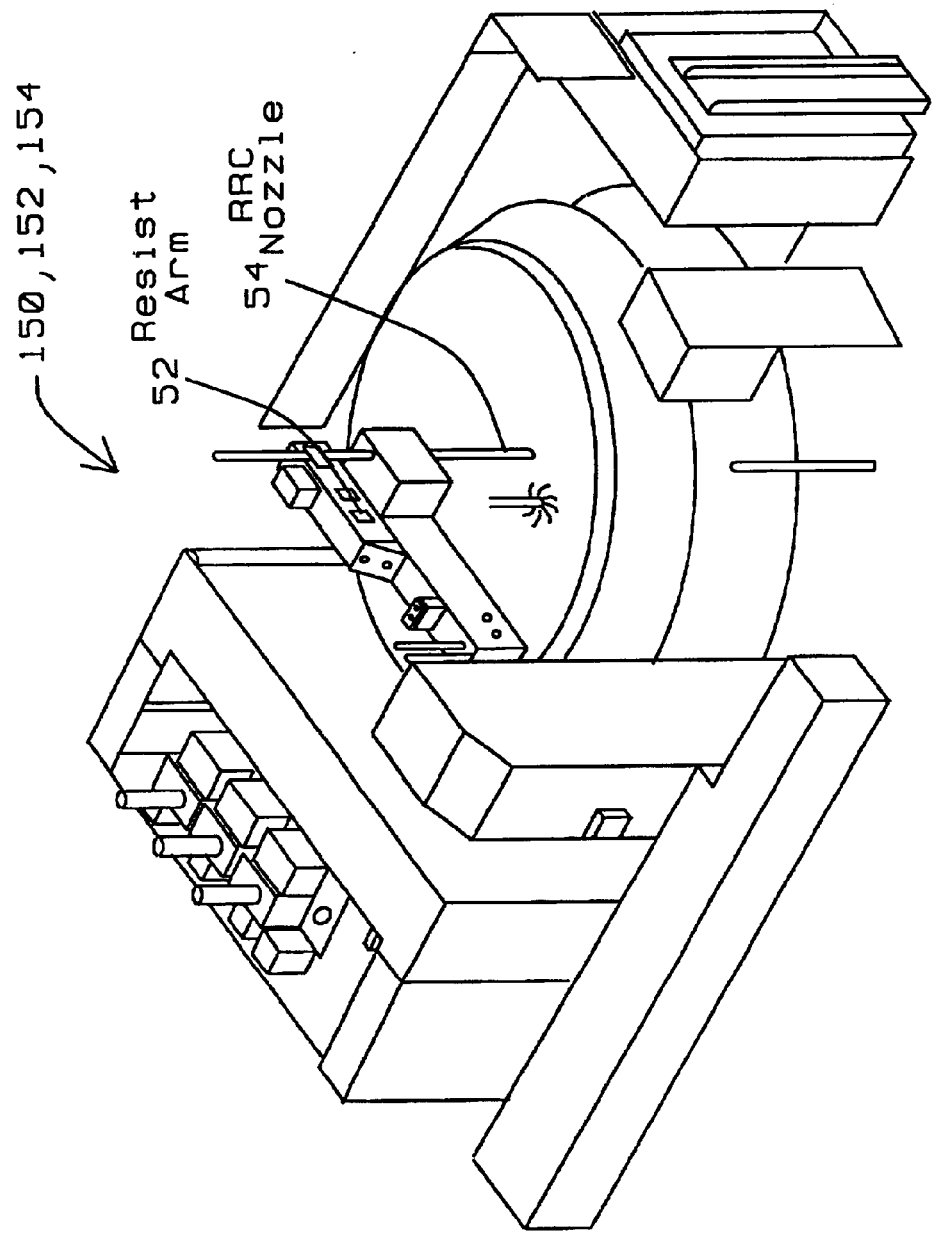
FIG. 3 – Prior Art

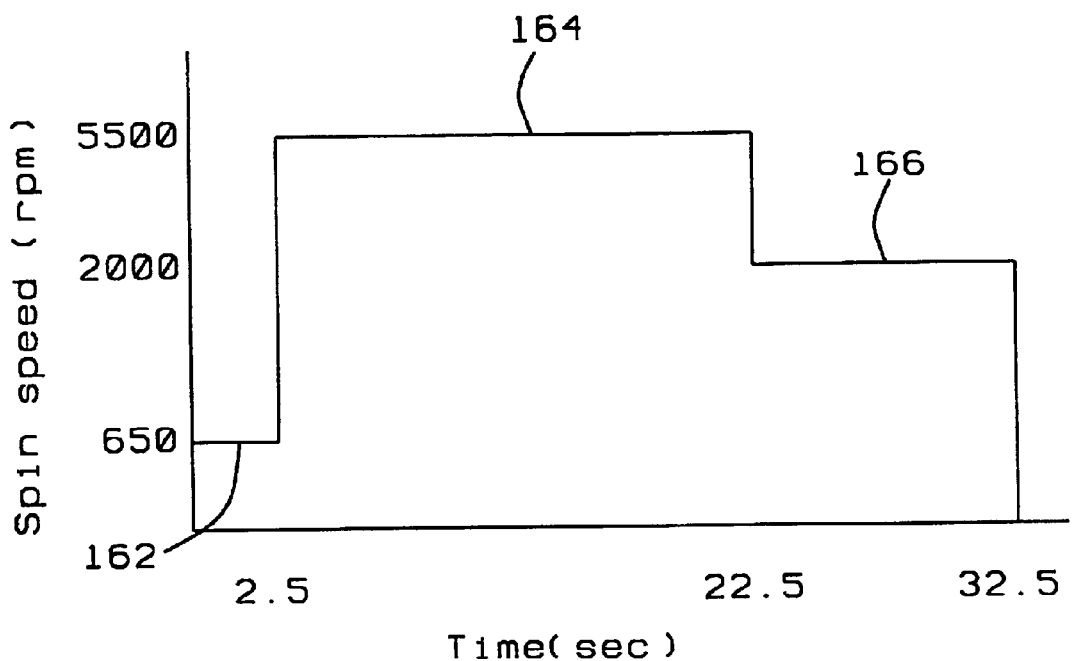
FIG. 4 — Prior Art
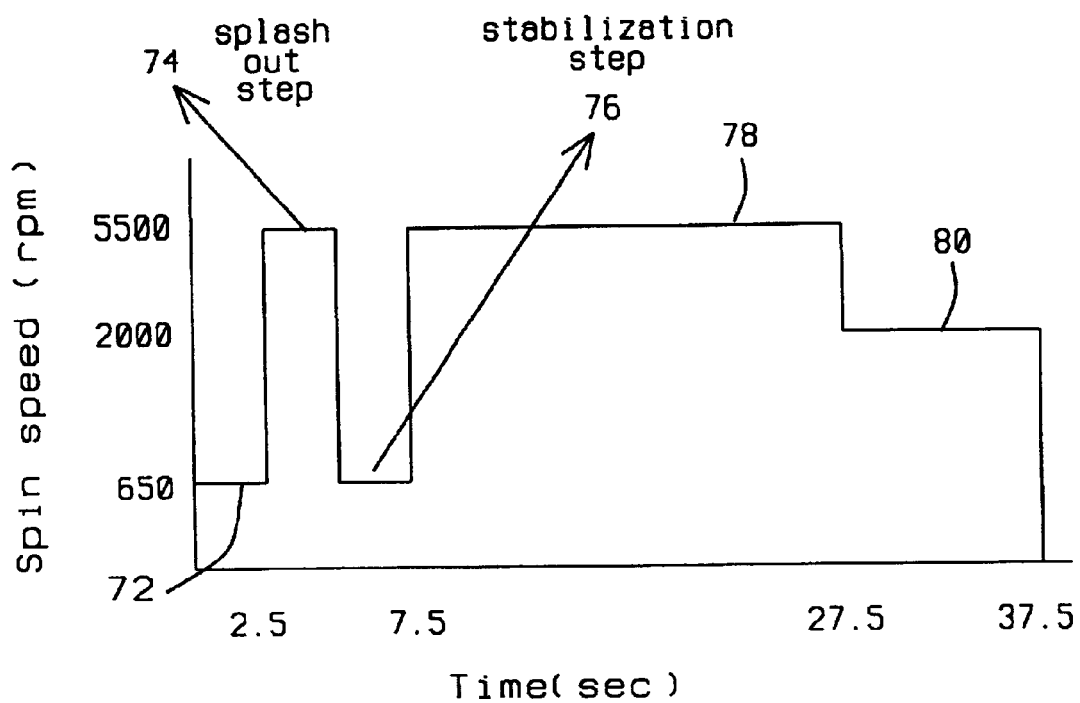
FIG. 5

METHOD TO MINIMIZE ISO-DENSE CONTACT OR VIA GAP FILLING VARIATION OF POLYMERIC MATERIALS IN THE SPIN COAT PROCESS

FIELD OF THE INVENTION

The present invention relates generally to fabrication of integrated circuit devices, and more particularly, to a method of creating small geometry dual-damascene structures while avoiding problems of surface coating like gap-fill.

BACKGROUND OF THE INVENTION

It has always been challenging to fill polymeric materials in the iso-dense contact or via with less filling variation. It was also challenging to etch the dual damascene structures on top of via with various pitches of via hole present in the chip.

As shown in FIGS. 1A, 1B and 1C, bottom anti-reflective coating (BARC) 114; 124; 134 always unevenly fills via openings 116; 126; 136 of different pitches like 1:1 of FIG. 1A, 1:3 of FIG. 1B and 1:5 of FIG. 1C on the same wafer. It is noted that the via opening densities of FIGS. 1A, 1B and 1C may be on differing portions of the same wafer 111.

BARC has a tendency to fill to a greater degree in the iso-dense pattern vias 136 of FIG. 1C compared to dense pattern via openings 116 of FIG. 1A with the moderate density pattern vias 126 of FIG. 1B having BARC 124 filled via openings 126 falling between FIGS. 1C and 1A as shown. During the subsequent trench etching step of the dual damascene process, it is difficult to optimize the trench etch recipe due to uneven filling of the via openings 116; 126; 136 within the differing via opening densities FIGS. 1A, 1B and 1C of the wafer 111. Uneven BARC 114; 124; 134 filling always cause either over etch of the substrate 112; 122; 132 due to less BARC fill 114 in dense via openings 116 as shown in FIG. 1A or fence formation because of more BARC filling 134 in iso-dense via openings 136 as shown in FIG. 1C during trench etching. Both are undesirable for the ideal dual damascene process.

In the development of semiconductor industry, an improvement in operation speed of the device has always been a technology that all semiconductor manufacturers are competing. With a rapid development of an integrated circuit process, a resistance of a conductive line and a parasitic capacitance between the conductive lines are determined as two key factors among all factors for influencing the operation speed of the device. Accordingly, a metal layer having a low resistance, such as a copper layer can substitute for an aluminum layer used in the conventional method for reducing the resistance of the conductive line. A low dielectric constant (k) material, such as a low-k organic dielectric layer can substitute for a silicon oxide layer used in the conventional method for reducing the parasitic capacitance between the conductive lines.

Generally, a dual damascene technique is a metal interconnect process with a high reliability and low cost, while a material selection for the metal interconnect is not limited by etching process for the metal. Therefore, this technique is widely applied to the manufacture of the copper line to reduce the resistance of the conductive line, and to further improve the operation speed and quality of the IC device. As there is a demand for a high operation speed of the device, fabricating the dual damascene with the low-k material layer has been practiced in the metal interconnect process of the semiconductor industry. Dual damascene is a multi-level interconnection process in which, in addition to forming the grooves of single damascene, conductive via openings are also formed.

As shown in FIGS. 2A and 2B, the dual damascene process requires two masking steps. FIG. 2A illustrates that first, the via 144 pattern within a low-k material layer 142 formed over a substrate 140 is etched. FIG. 2B that second, the trench 146 pattern for the conductive lines are formed above the respective etched via 144' pattern.

In the current practice of semiconductor manufacturing the liquid materials are most often deposited using either spin or spray coating methods employing a coater cup of a spin coater 150 as shown in FIG. 3 having a resist arm 152 and a supply nozzle (RRC nozzle) 154.

In a conventional spin coating process the semiconductor wafer to be processed is placed on a rotatable chuck and held in place by vacuum. The chuck is referred to by a variety of names, including spin chuck and vacuum chuck. The spin chuck has a diameter slightly less than that of the semiconductor wafer. The wafer is positioned on the chuck such that it is resting in a level horizontal plane with the inactive surface, designated as the bottom, in contact with the chuck and the opposite top surface is coated with the desired solution. In standard systems the chuck is powered and rotated by a motor.

In the spin coating process, the solution of specific quantity can be dispensed onto the wafer from a supply nozzle prior to spinning the wafer, which is referred to as static dispense or after the semiconductor wafer has been set in motion, which is termed dynamic dispense. In either case after the solution has been dispensed onto the top surface, the wafer is spun at a constant speed to establish a desired relatively uniform thickness of the solution across the wafer. Once the liquid layer acquires the relatively uniform and symmetrical profile, the remainder of the spin cycle allows the solvent in the solution to evaporate to produce a solid film on the wafer top surface.

After the solution is dispensed onto the wafer it is distributed uniformly over the surface largely as a result of the radial distribution of the liquid due to centrifugal and drag forces created by the spinning of the wafer. The solution deposited on the wafer goes through a number of stages during the spin process, primarily due to the fluid dynamics created by the spinning substrate.

In the conventional dual damascene process, to protect the via bottom during the trench etch (FIG. 2B), the most commonly used method is to completely fill the via opening 144 of FIG. 2A with BARC and than etch back BARC to give the equally height filled vias 144. This leads to extra steps and complexity in the process.

The resist coater shown in FIG. 3 may be used in the conventional coating method for coating a BARC film on semiconductor wafer.

FIG. 4 is a graph illustrating rotating speed (the y-axis) versus time (the x-axis) for a wafer in each step in the conventional coating method to fill the vias with BARC prior to the trench process to form the dual damascene structure opening. BARC having, for example, a relatively low viscosity on the order of 6 cp. is used for a BARC film coating. The wafer is held on the wafer chuck and the BARC is first dripped on a wafer from the resist supply nozzle, while rotating the wafer at a low rotational speed of about 650 rpm as at 162. The BARC is spread on the whole coating surface of the wafer for 2.5 seconds as at 162.

Next, the dripping of BARC is suspended, and the wafer is rotated for 20 seconds at a rotational speed of about 5500 rpm as at 164, so that a BARC film having a desired thickness, i.e. e.g., of 600 Å is formed.

Then, a rinse agent is sprayed from the cleaning nozzle for 10 to 20 seconds at a rotational speed of about 2000 as at 166, and the back surface edge of the wafer is cleaned. Thus, the coating step is terminated. Subsequently, the process proceeds to the baking steps, where the residual solution in the BARC is completely removed.

U.S. Pat. No. 6,251,487 B1 to Yonaha describes a method for coating a resist film.

U.S. Pat. No. 4,741,926 to White et al. describes a spin-coating procedure.

U.S. Pat. No. 6,319,821 B1 to Liu et al. describes a dual damascene process with BARC and via fill.

U.S. Pat. No. 6,042,999 to Lin et al. also describes a dual damascene process with BARC and via fill.

SUMMARY OF THE INVENTION

Accordingly, it is an object of the present invention to provide a method to spin coat a polymeric film on a wafer while minimizing the gap fill variation within a series of wafer openings having varying pitch densities.

Other objects will appear hereinafter.

It has now been discovered that the above and other objects of the present invention may be accomplished in the following manner. Specifically, a polymeric material film is spin coated upon a wafer rotatably mounted within a spin coater using the following four steps. A first step of rotating the wafer on an axis perpendicular to the wafer surface while applying a predetermined amount of polymeric material while rotating the wafer at a rotational speed of from about 300 to 1200 rpm for from about 2.5 to 5 seconds to spread the polymeric material on the whole surface of the wafer. A second step of increasing the rotational speed of the wafer to about 5500 rpm for about 2.5 seconds. A third step of decreasing the rotational speed of the wafer to about 300 to 1200 rpm for about 2.5 seconds. A fourth step of increasing the rotational speed of the wafer to about 5500 rpm for about 20 seconds to form the polymeric material film having a predetermined thickness over the whole surface of the wafer.

BRIEF DESCRIPTION OF THE DRAWINGS

The present invention will be more clearly understood from the following description taken in conjunction with the accompanying drawings in which like reference numerals designate similar or corresponding elements, regions and portions and in which:

FIGS. 1A, 1B and 1C schematically illustrate varying via opening filled densities on a wafer.

FIGS. 2A and 2B schematically illustrate the sequential formation of a dual damascene opening.

FIG. 3 schematically illustrates a resist coater.

FIG. 4 is a graph of wafer rotational speed versus time of a conventional wafer coating method.

FIG. 5 is a graph of wafer rotational speed versus time of the wafer coating method of the present invention.

DETAILED DESCRIPTION OF THE PREFERRED EMBODIMENT

Figure 6A:
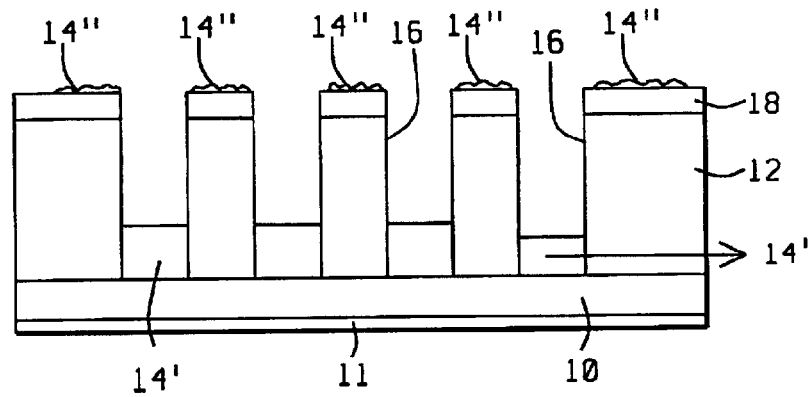
FIGS. 6A, 6B and 6C schematically illustrate varying via opening filled densities on a wafer after the splash-out step of the present invention.

The method of the present invention has been developed specially for bottom anti-reflective coating (BARC) filling within via openings although one skilled in the art will recognizes that other materials may be used to fill the via openings, as noted below, and that other structure may also be filled with such materials.

The present invention relates to a coating method for coating a BARC film on a wafer having a diameter of eight (8) inches by a spin coating process, wherein the BARC film is filled within via openings with less filling differences between different pitches of the via openings. One skilled in the art will also recognize that the novel method of the present invention may be applied to wafers having other diameters. The BARC (film) in this specification refers to a wide concept including all kinds of polymeric materials in spin-coat processes and may preferably be a top anti-reflective coating (TARC), flowable dielectrics in spin-on-glass process, conformal BARC (AR3) or a planarizing BARC (DUV 32-6 or NCA 32-6 available from Nissan Chemicals), is more preferably a top anti-reflective coating (TARC) or a conformal BARC and is most preferably a planarizing BARC (DUV 32-6 or NCA 32-6 available from Nissan Chemicals).

In the present invention, a novel method of polymeric materials coating has been discovered. The present invention provides a novel technique to minimize the polymeric material filling variations in via openings and contact holes through all the pitches.

As shown in FIG. 5, a graph of wafer rotational speed versus time, a novel high rpm splash-out step in combination with a novel stabilization step are incorporated to minimize iso-dense contact or via gap filling variations.

It is noted that all references to BARC include all kinds of polymeric materials used in spin-coat processes as noted above.

The First Step 72

In the first step 72 as shown in FIG. 5, a predetermined amount of the BARC is dripped on a wafer 11 while allowing the wafer 11 to be rotated at a low rotational speed of about 650 rpm (variable from about 300 to 1200 rpm depending upon the polymer viscosity, density and amount of filling required in via openings/holes). BARC is spread on to the whole surface of the wafer 11 for about 2.5 seconds (variable from about 2.5 to 5 seconds also depending upon the polymer viscosity and density). The dripping of the BARC is suspended at the time when the BARC is evenly spread on the whole surface of the wafer 11.

The BARC fills the varying pitches of via openings/holes in a manner similar to that shown in FIGS. 1A, 1B and 1C.

The Second, Splash-Out Step 74

In the second step 74 as shown in FIG. 5, the novel splash-out step 74, the rotational speed of the wafer 11 is increased from the 650 rpm rotational speed of the first step 72 to about 5500 rpm for about 2.5 seconds with higher acceleration. The second, splash-out, step 74 is used to remove the BARC filling the via openings/holes. The splash-out step 74 time is critical. More time will give adverse effects by drying out the BARC inside the via openings/holes before stabilization.

Figure 6B:
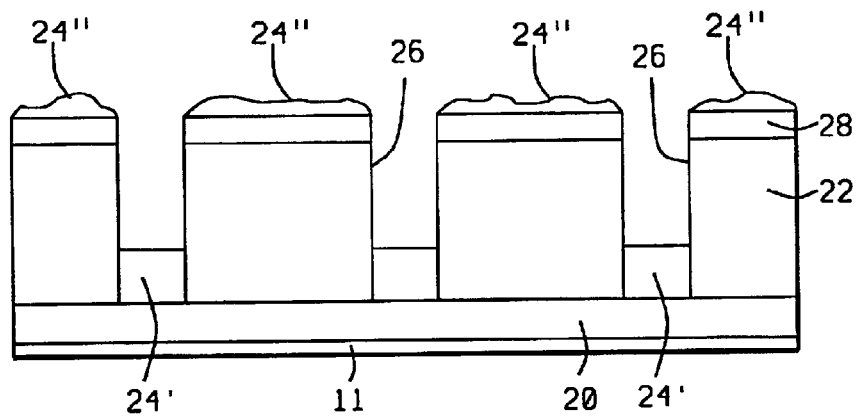
Figure 6C:
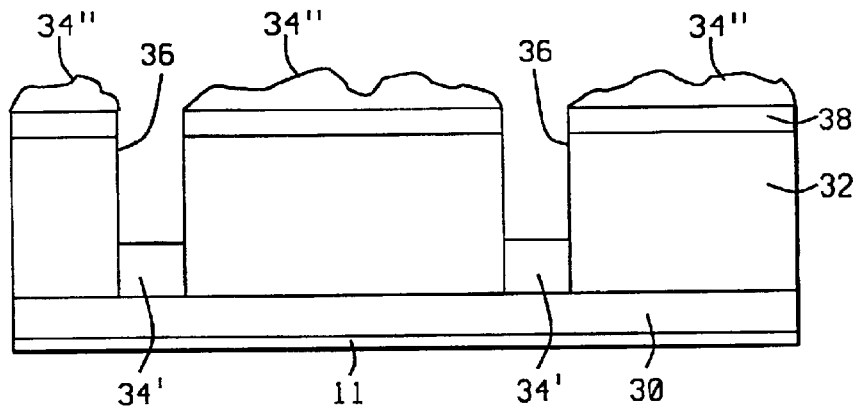

As shown in FIGS. 6A, 6B and 6C the second splash-out step 74 causes BARC to be expelled from the respective via openings/holes 16, 26, 36 and resting as at 14", 24", 34", respectively, upon the etched substrate 12, 22, 32 adjacent the respective via openings/holes 16, 26, 36. This reduces the amount of BARC 14', 24', 34' remaining within the respective via openings/holes 16, 26, 36.

The Third, Stabilization Step 76

In the novel third, stabilization step 76 as shown in FIG. 5, the rotational speed is lowered from the second splash-out step 74 rotational speed of about 5500 rpm to the first step 72 rotational speed of about 650 rpm (variable from about 300 to 1200 rpm depending upon the polymer viscosity, density and amount of filling required in via openings/holes) for about 2.5 seconds.

Figure 7A:
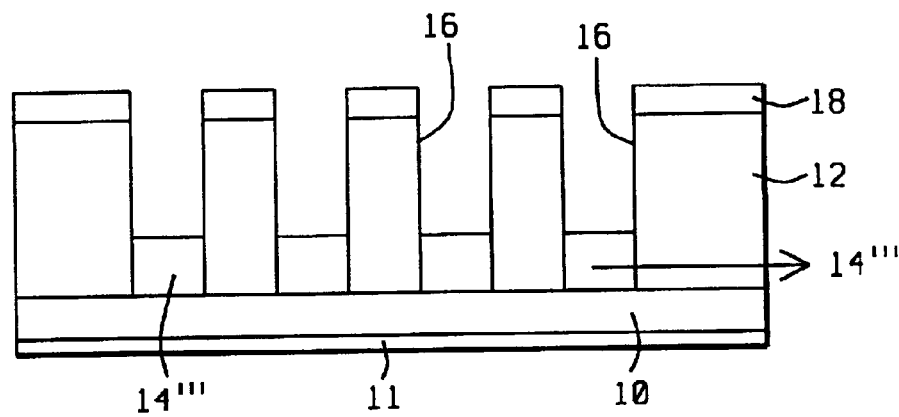
FIGS. 7A, 7B and 7C schematically illustrate varying via opening filled densities on a wafer after the stabilization step of the present invention.
Figure 7B:
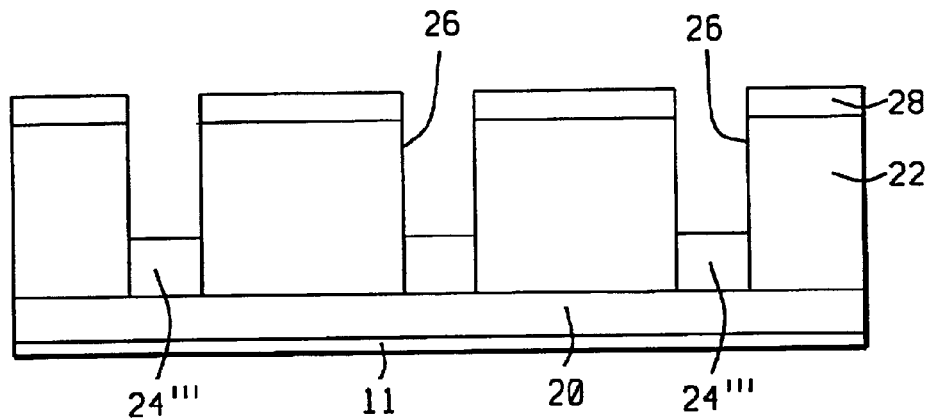
Figure 7C:
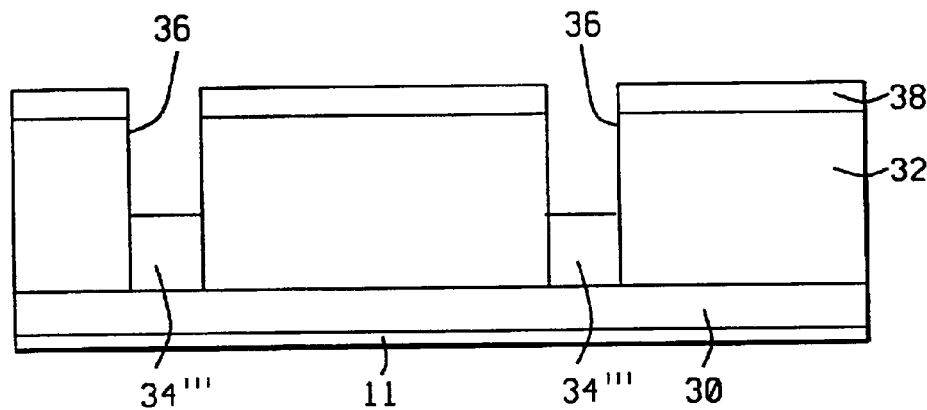

As shown in FIGS. 7A, 7B and 7C, the stabilization step 76 serves to resettle an amount of respective expelled BARC 14", 24", 34" of FIGS. 6A, 6B and 6C back within the respective via openings/holes 16, 26, 36, with a greater amount of BARC re-filling in the denser pitches as in FIG. 7A, less in the less dense pitches as in FIG. 7B and essentially none in the iso-dense pitches as in FIG. 7C, thus serving to greatly equalize the level of BARC filling across the range of pitches of the via openings/holes.

The Fourth Step 78

In the fourth step the rotational speed of the third, stabilization step 76 is increased to a predetermined rotational speed of the wafer 11 which is determined from a correlation of the wafer 11 which regulates the thickness of the BARC film. For example, the wafer 11 is rotated for about 20 seconds at a rotational speed of about 5500 rpm, so that a BARC film 18, 28, 38 having a desired thickness, i.e. e.g., of about 600 Å is formed.

The Fifth Step 80

In a fifth step 80, a rinse agent is sprayed from the cleaning nozzle for about 10 to 20 seconds, and the back surface edge of the wafer 11 is cleaned. Thus, the coating step is terminated. Subsequently, the process proceeds to the baking steps, where the residual solution in the BARC is completely removed.

In the present invention, during the first step, the BARC is spread on the whole surface of the wafer 11 by allowing the wafer 11 to be rotated at a low rotational speed while dripping the BARC on the wafer 11 in the same manner as the convention method.

Figure 8A:
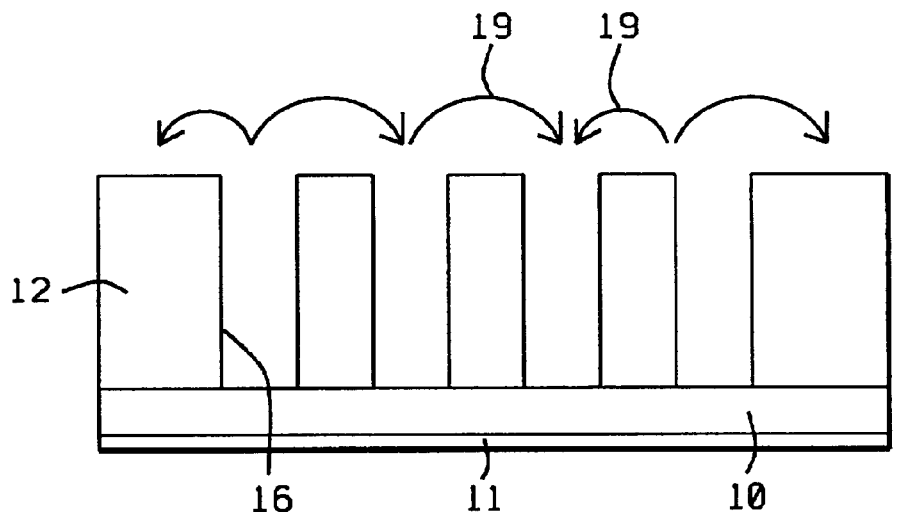
FIGS. 8A and 8B schematically illustrate the inventor's proposed mechanism of the splash-out and stabilization steps of the present invention.
Figure 8B:
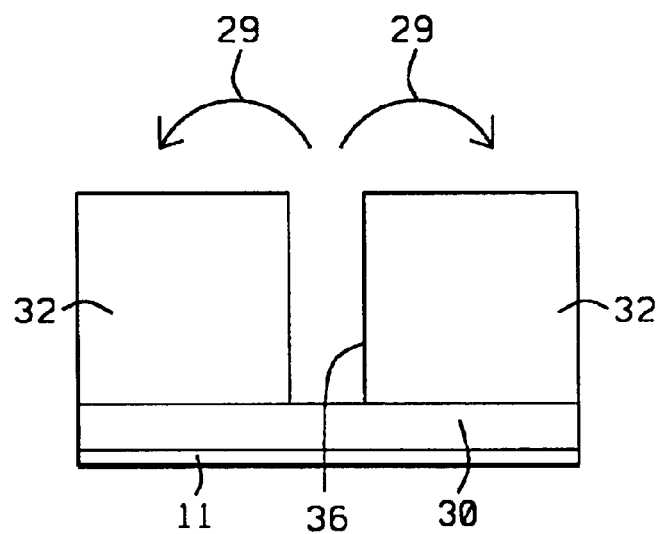

The novel steps are the second, splash-out step 74 combined with the novel third, stabilization step 76. FIGS. 8A and 8B explains the principle/mechanism the inventor believes to be behind this method. Due to the novel high-rpm splash-out step 74 the amount of BARC removed from dense pitch via openings/holes 16 (FIG. 8A) or iso-dense pitch via openings/holes 36 (FIG. 8B) is same but in the case of the dense pitch the expelled/removed BARC refills the via openings/holes 16 again. In the case of the iso-dense pitch, the excessive amount of the BARC is spun-off from the wafer 11 because of no nearby via openings/holes 36 to fill back into.

The splash-out step 74 is followed by the stabilization step 76 to fine tune the re-filling of the via openings/holes 16, 26, 36. The splash-out step 74 time is critical. More time will give adverse effect by drying out the BARC inside the via openings/holes 16, 26, 36 before the stabilization step 76.

The first and fourth steps 72, 78 control the height of filling of the BARC/polymeric materials in the via openings/contact holes 16, 26, 36. A higher spin speed in the first step 72 during dispensing of the BARC on the wafer 11 will allow for less filling of the via openings/contact holes 16, 26, 36. The novel second splash-out step 74 and the third stabilization step 76 control the gap filling height variation across different pitches of the via openings/contact holes 16, 26, 36.

Further processing may then proceed to form small-dimension dual damascene structures that provide anti-reflective coating advantages when using BARC, while at the same time avoiding conventional problems of poor anti-reflective coating on the surface of the openings of the dual damascene structures.

Experimental Results

ACT 8 TEL TRACK was used to coat planarizing BARC on via openings/contact holes on Black Diamond™ wafers. The depth of the via openings/contact holes depth in this experiment was 10,000 Å.

The following experimental data gives the height/performance of the BARC fill in the via openings/contact holes. All the measurements are in Angstroms (Å) for the 1:1, 1:3 and 1:5 via pitches for the new coating method (Table 1A) and for the conventional BARC coating method (Table 1B).

TABLE 1A

Novel BARC coating method of the present invention.

| Pitch of Vias | 1:1 | 1:3 | 1:5 | Difference of 1:3 to 1:1 | Difference of 1:5 to 1:1 | Difference of 1:5 to 1:3 |
| --- | --- | --- | --- | --- | --- | --- |
| BARC height Å | 3000 | 4300 | 4800 | 1300 | 1800 | 500 |

TABLE 1B

Conventional BARC coating Method

| Pitch of Vias | 1:1 | 1:3 | 1:5 | Difference of 1:3 to 1:1 | Difference of 1:5 to 1:1 | Difference of 1:5 to 1:3 |
| --- | --- | --- | --- | --- | --- | --- |
| BARC height Å | 4630 | 6760 | 7920 | 2130 | 3290 | 1160 |

As demonstrated in the above tables, the via gap filling difference by using the method of the present invention between the 1:3 to 1:1 pitches was reduced by about 850 Å; the via gap filling difference between the 1:5 to 1:1 pitches was reduced by about 1490 Å and the via gap filling difference between the 1:5 to 1:3 pitches was reduced by about 660 Å.

Advantages of the Present Invention

The method of the present invention provides a unique method to minimize iso-dense contact or via gap filling variation of polymeric materials in the spin coat process and minimizes the via BARC filling variation in the dual damascene process. The conventional methods for full via filling need an additional BARC etch back and cleaning steps that increases the processing time and complexity. Further, the etching steps are more challenging for the conventional methods and ideal results cannot be obtained. The method of the present invention reduces the complexity of BARC etching and reduces the additional process steps.

For dual damascene openings smaller than 0.35 μm, a conventional bottom anti-reflective coating (BARC) coating may be applied in accordance with the method of the present invention to protect the bottom stop layer 10, 20, 30 and preventing punch-through of the bottom stop layer 10, 20, 30 during the trench etch process.

While particular embodiments of the present invention have been illustrated and described, it is not intended to limit the invention, except as defined by the following claims.

I claim:

1. A method for spin coating a polymeric material film upon a wafer rotatably mounted within a spin coater; the wafer having a surface, including the steps of:
    a first step of rotating the wafer on an axis perpendicular to the wafer surface while applying a predetermined amount of polymeric material while rotating the wafer at a rotational speed of from about 300 to 1200 rpm for from about 2.5 to 5 seconds to spread the polymeric material on the whole surface of the wafer;
    a second step of increasing the rotational speed of the wafer to about 5500 rpm for about 2.5 seconds;
    a third step of decreasing the rotational speed of the wafer to about 300 to 1200 rpm for about 2.5 seconds; and
    a fourth step of increasing the rotational speed of the wafer to about 5500 rpm for about 20 seconds to form the polymeric material film having a predetermined thickness over the whole surface of the wafer; wherein the wafer includes a series of openings that are partially filled with the polymeric material.

2. The method of claim 1, wherein the polymeric material is a top anti-reflective coating (TARC), flowable dielectrics in spin-on-glass process, conformal bottom anti-reflective coating (BARC) or a planarizing BARC.

3. The method of claim 1, wherein the polymeric material is a top anti-reflective coating (TARC) or a conformal BARC.

4. The method of claim 1, wherein the polymeric material is a planarizing BARC.

5. The method of claim 1, wherein the polymeric material film is an anti-reflective coating or a bottom anti-reflective coating.

6. The method of claim 1, wherein the predetermined thickness of the polymeric material film is about 600 Å.

7. The method of claim 1, wherein the wafer is rotated at a rotational speed of about 650 rpm for about 2.5 seconds in the first step.

8. The method of claim 1, wherein the rotational speed of the third step is about 650 rpm.

9. The method of claim 1, including a fifth step of applying a rinse agent to the wafer.

10. The method of claim 1, including a fifth step of applying a rinse agent to the wafer for from about 10 to 20 seconds.

11. The method of claim 1, including the steps of:
    a fifth step of applying a rinse agent to the wafer; and
    a sixth step of baking the wafer.

12. The method of claim 1, wherein the wafer includes a series of openings having varying pitches; the series of openings having varying pitches being partially filled with polymeric material.

13. The method of claim 1, wherein the wafer includes a series of openings having varying pitches; the series of openings having varying pitches being partially filled with a substantially equal depth of polymeric material in each of the varying pitch openings.

14. The method of claim 1, wherein the wafer includes a series of openings having varying pitches; the series of openings having varying pitches being partially filled with a substantially equal depth of polymeric material in each of the varying pitch openings; the series of openings having a width of less than about 0.35 µm.

15. The method of claim 1, wherein the polymeric material has a viscosity of about 6 cp.

16. A method for spin coating a polymeric material film upon a wafer rotatably mounted within a spin coater; the wafer having a surface, including the steps of:
    a first step of rotating the wafer on an axis perpendicular to the wafer surface while applying a predetermined amount of polymeric material while rotating the wafer at a rotational speed of from about 300 to 1200 rpm for from about 2.5 to 5 seconds to spread the polymeric material on the whole surface of the wafer;
    a second step of increasing the rotational speed of the wafer to about 5500 rpm for about 2.5 seconds;
    a third step of decreasing the rotational speed of the wafer to about 300 to 1200 rpm for about 2.5 seconds;
    a fourth step of increasing the rotational speed of the wafer to about 5500 rpm for about 20 seconds to form the polymeric material film having a predetermined thickness over the whole surface of the wafer; and
    a fifth step of applying a rinse agent to the wafer for from about 10 to 20 seconds; wherein the wafer includes a series of openings that are partially filled with the polymeric material.

17. The method of claim 16, wherein the polymeric material is a top anti-reflective coating (TARC), flowable dielectrics in spin-on-glass process, conformal BARC or a planarizing BARC.

18. The method of claim 16, wherein the polymeric material is a top anti-reflective coating (TARC) or a conformal BARC.

19. The method of claim 16, wherein the polymeric material is a planarizing BARC.

20. The method of claim 16, wherein the polymeric material film is an anti-reflective coating or a bottom anti-reflective coating.

21. The method of claim 16, wherein the predetermined thickness of the polymeric material film is about 600 Å.

22. The method of claim 16, wherein the wafer is rotated at a rotational speed of about 650 rpm for about 2.5 seconds in the first step.

23. The method of claim 16, wherein the rotational speed of the third step is about 650 rpm.

24. The method of claim 16, including a sixth step of baking the wafer.

25. The method of claim 16, wherein the wafer includes a series of openings having varying pitches; the series of openings having varying pitches being partially filled with polymeric material.

26. The method of claim 16, wherein the wafer includes a series of openings having varying pitches; the series of openings having varying pitches being partially filled with a substantially equal depth of polymeric material in each of the varying pitch openings.

27. The method of claim 16, wherein the wafer includes a series of openings having varying pitches; the series of openings having varying pitches being partially filled with a substantially equal depth of polymeric material in each of the varying pitch openings; the series of openings having a width of less than about 0.35 µm.

28. A method for spin coating a polymeric material film upon a wafer rotatably mounted within a spin coater; the wafer having a surface with a series of openings having varying pitches, including the steps of:
    a first step of rotating the wafer on an axis perpendicular to the wafer surface while applying a predetermined amount of polymeric material while rotating the wafer at a rotational speed of from about 300 to 1200 rpm for from about 2.5 to 5 seconds to spread the polymeric material on the whole surface of the wafer and partially filling the series of openings having varying pitches with the polymeric material;

a second step of increasing the rotational speed of the wafer to about 5500 rpm for about 2.5 seconds to expel a portion of the polymeric material with the series of openings having varying pitches;

a third step of decreasing the rotational speed of the wafer to about 300 to 1200 rpm for about 2.5 seconds to return some of the expelled portion of the polymeric material back to some of the series of openings; and a fourth step of increasing the rotational speed of the wafer to about 5500 rpm for about 20 seconds to form the polymeric material film having a predetermined thickness over the whole surface of the wafer.

29. The method of claim 28, wherein the polymeric material is a top anti-reflective coating (TARC), flowable dielectrics in spin-on-glass process, conformal BARC or a planarizing BARC.

30. The method of claim 28, wherein the polymeric material is a top anti-reflective coating (TARC) or a conformal BARC.

31. The method of claim 28, wherein the polymeric material is a planarizing BARC.

32. The method of claim 28, wherein the polymeric material film is an anti-reflective coating or a bottom anti-reflective coating.

33. The method of claim 28, wherein the predetermined thickness of the polymeric material film is about 600 Å.

34. The method of claim 28, wherein the wafer is rotated at a rotational speed of about 650 rpm for about 2.5 seconds in the first step.

35. The method of claim 28, wherein the rotational speed of the third step is about 650 rpm.

36. The method of claim 28, including a fifth step of applying a rinse agent to the wafer.

37. The method of claim 28, including a fifth step of applying a rinse agent to the wafer for from about 10 to 20 seconds.

38. The method of claim 28, including the steps of:
a fifth step of applying a rinse agent to the wafer; and
a sixth step of baking the wafer.

39. The method of claim 28, wherein the varying pitches of the series of openings range from iso-dense to dense.

40. The method of claim 28, wherein the varying pitches of the series of openings range from iso-dense to dense and wherein substantially none of the polymeric material expelled from the dense pitch openings during the second step is returned to the dense pitch openings during the fourth step.

41. The method of claim 28, wherein the wafer includes a series of openings having varying pitches; varying pitches including a series of about 1:1 pitch dense openings, a series of about 1:3 pitch dense openings and a series of about 1:5 pitch iso-dense openings.

42. The method of claim 28, wherein the wafer includes a series of openings having varying pitches; varying pitches including a series of about 1:1 pitch dense openings, a series of about 1:3 pitch dense openings and a series of about 1:5 pitch iso-dense openings and wherein substantially none of the polymeric material expelled from the about 1:5 iso-dense pitch openings during the second step is returned to the about 1:5 iso-dense pitch openings during the fourth step.

43. The method of claim 28, wherein the series of openings have a width of less than about 0.35 μm.

44. The method of claim 28, wherein the polymeric material has a viscosity of about 6 cp.

* * * * *